United States Patent
Nam et al.

(10) Patent No.: US 9,892,942 B2
(45) Date of Patent: Feb. 13, 2018

(54) SUBSTRATE PROCESSING APPARATUS

(71) Applicant: NPS Corporation, Hwaseong-si, Gyeonggi-do (KR)

(72) Inventors: Won Sik Nam, Hwaseong-si (KR); Kang Heum Yeon, Hwaseong-si (KR); Dae Seok Song, Hwaseong-si (KR)

(73) Assignee: NPS CORPORATION (KR)

( * ) Notice: Subject to any disclaimer, the term of this patent is extended or adjusted under 35 U.S.C. 154(b) by 274 days.

(21) Appl. No.: 14/572,768

(22) Filed: Dec. 16, 2014

(65) Prior Publication Data
US 2015/0241125 A1 Aug. 27, 2015

(30) Foreign Application Priority Data
Feb. 24, 2014 (KR) .................. 10-2014-0021134

(51) Int. Cl.
*F27D 5/00* (2006.01)
*H01L 21/67* (2006.01)
*C23C 16/26* (2006.01)
*C23C 16/48* (2006.01)
*H01L 21/687* (2006.01)

(52) U.S. Cl.
CPC ........ *H01L 21/67109* (2013.01); *C23C 16/26* (2013.01); *C23C 16/481* (2013.01); *H01L 21/6719* (2013.01); *H01L 21/67115* (2013.01); *H01L 21/68785* (2013.01)

(58) Field of Classification Search
CPC ..... F27D 5/0006; F27D 5/0037; F27D 5/0068
See application file for complete search history.

(56) References Cited

U.S. PATENT DOCUMENTS

| | | | |
|---|---|---|---|
| 4,686,113 A * | 8/1987 | Delfino | C23C 16/507 118/50.1 |
| 6,569,250 B2 * | 5/2003 | Paisley | C23C 16/325 118/730 |
| 2003/0079689 A1 * | 5/2003 | Sumakeris | C23C 16/4581 118/725 |
| 2007/0186858 A1 * | 8/2007 | Kimoto | C23C 16/4588 118/728 |

(Continued)

FOREIGN PATENT DOCUMENTS

| | | |
|---|---|---|
| JP | 2007284765 A | 11/2007 |
| KR | 20100111447 A | 10/2010 |

(Continued)

*Primary Examiner* — Nathaniel Herzfeld
(74) *Attorney, Agent, or Firm* — Renaissance IP Law Group LLP (57) ABSTRACT

The present invention relates to a substrate processing apparatus. The substrate processing apparatus includes a chamber including a chamber body of which one side is opened and having an inner space and a door opening and closing the chamber body, first susceptors disposed to be spaced apart from each other within the chamber, supports each of which is connected to one side surface of the door to support the substrate in parallel to the first susceptor, second susceptors disposed on the supports along a longitudinal direction of the door, the second susceptors being spaced apart from each other in a direction crossing the first susceptors, and at least one heat source unit disposed at least one surface of the chamber to heat the susceptors.

7 Claims, 4 Drawing Sheets

(56) References Cited

U.S. PATENT DOCUMENTS

| | | | | |
|---|---|---|---|---|
| 2009/0020227 A1* | 1/2009 | Andou | ............. | H01L 21/67109 156/345.37 |
| 2010/0092697 A1* | 4/2010 | Poppe | ............... | C23C 16/45502 427/585 |
| 2012/0192789 A1* | 8/2012 | Kramer | ............... | C23C 16/4412 118/712 |
| 2012/0234240 A1* | 9/2012 | Won | ........................ | C23C 16/26 118/719 |

FOREIGN PATENT DOCUMENTS

| | | | |
|---|---|---|---|
| KR | 20110100428 A | | 9/2011 |
| KR | 101182638 B1 | | 9/2012 |
| KR | 101190603 B1 | | 10/2012 |
| KR | 20130098664 A | * | 9/2013 |

* cited by examiner

SUBSTRATE PROCESSING APPARATUS

BACKGROUND

The present disclosure relates to relates to a substrate processing apparatus, and more particularly, to a substrate processing apparatus capable of uniformly processing a substrate.

Recently, rapid thermal processing (RTP) methods are being widely used as methods for thermally processing a substrate.

Such a RTP method is a method in which a substrate is thermally processed by irradiating radiation light, which is emitted from a heat source such as a tungsten lamp, onto the substrate. According to the RTP method, the substrate may be quickly heated or cooled when compared to an existing substrate thermal processing method using a furnace. In addition, pressure conditions or temperature bands may be easily controlled to improve thermal processing quality of the substrate.

The substrate processing apparatus according to the related art in which the RTP method has been used mainly includes a chamber providing a space in which a substrate is processed, a susceptor supporting the substrate within the chamber, a heat source irradiating radiation light to heat the substrate, a heating block connected to the chamber to allow the heat source to be mounted thereon, and a transmission window disposed on a connection portion between the heating block and the chamber to allow the radiation light irradiated from the heat source to be transmitted therethrough.

As the substrate increases in area, the substrate processing apparatus for processing the substrate are significantly increasing in volume. Generally, since the substrate is horizontally loaded in the chamber, the chamber in which the substrate is processed increases in volume, and thus, a wide space is required for installing the chamber. Also, since another space for storing the substrate is also required, costs for equipment to deal with the space issues increase, and accordingly, products are reduced in price competitiveness.

Also, when the substrate having the large area is horizontally loaded, the substrate is sagged downward due to the weight of the substrate itself, and thus it is difficult to uniformly process the entire substrate.

Also, graphene is a conductive material having a thickness corresponding to one atom layer and an arrangement in which carbon atoms are arranged in honeycomb shape on two-dimensional plane. Thus, the graphene may act as an important model for studying various low-dimensional nano phenomena. Also, the graphene is structurally and chemically very stable as well as is very excellent conductor. It has been predicted that electron mobility in the graphene is approximately one hundred times faster than silicon to allow an amount of electrons that is approximately one hundred times more than that of a copper to flow.

Since the graphene is formed of only carbon that is a relatively lightweight element, one-dimensional or two-dimensional nano pattern may be easily processed on the graphene. Particularly, when taking these advantages, semiconductor-conductor properties may be adjusted, and also a wide functional device such as a sensor, memory, and so on may be manufactured by using diversity in chemical coupling property of the carbon.

However, as described above, although the graphene has excellent electrical, mechanical, and chemical advantages, a practical mass synthesizing method that is applicable to the actual common use is not still suggested. Typically, there is a mainly known method in which graphite is mechanically pulverized to disperse the pulverized graphite in a solution, thereby manufacturing a thin film using a self-assemble phenomenon. In this case, although allowing lower prices, a lot of graphene pieces overlap each other and is connected to each other to cause insufficient electrical and mechanical properties. Also, in recent years, although a large-area graphene synthesizing technology by using chemical evaporation deposition is introduced to make possible to manufacture a graphene thin film having conductivity that comes close to metal, this technology is need to pay a high price and require a relatively high process temperature.

PRIOR ART DOCUMENTS

Patent Documents (Patent document 1) KR2010-0111447 A1
(Patent document 2) KR2011-0100428 A1

SUMMARY

The present disclosure provides a substrate processing apparatus capable of uniformly processing a substrate.

The present discloser also provides a substrate processing apparatus capable of mass-producing grapheme through a rapid thermal processing method to commercialize a graphene thin film.

In accordance with an exemplary embodiment, a substrate processing apparatus including: a chamber including a chamber body of which one side is opened and having an inner space and a door opening and closing the chamber body; first susceptors disposed to be spaced apart from each other within the chamber; supports each of which is connected to one side surface of the door to support the substrate in parallel to the first susceptor; second susceptors disposed on the supports along a longitudinal direction of the door, the second susceptors being spaced apart from each other in a direction crossing the first susceptors; and at least one heat source unit disposed at least one surface of the chamber to heat the susceptors.

The chamber may include: a gas injection hole defined in one side of the chamber to inject process gas therethrough; and a gas exhaust hole defined in the other side facing the gas injection hole to exhaust the gas within the chamber therethrough.

A vacuum line for adjusting an inner pressure of the chamber and a cooling line for cooling the inside of the chamber may be connected to the gas exhaust hole, and the vacuum line and the cooling line may be selectively opened and closed.

The chamber body may include: a hollow housing of which a front surface and at least one side surface are opened; and a cover connected to the opened side surface of the housing, wherein the heat source unit may be disposed on the cover.

Each of the first and second susceptors may be formed of at least one of graphite or graphite coated with silicon carbide (SiC), silicon carbide (SiC), silicon nitride ($Si_3N_4$), alumina ($Al_2O_3$), aluminum nitride (AlN), and quartz.

Each of the first susceptors may be fixed to an inner wall of the chamber by using a fixing unit that partially connects an edge of the first susceptor to the inner wall of the chamber.

The support may include: a pair of support parts parallelly spaced apart from each other, the pair of supports having a plurality of fixing holes; and a plurality of fixing members coupled to the plurality of fixing holes to fix the substrate; wherein the second susceptors are fixed to the supports so that the second susceptors are spaced by a distance greater than a length of the substrate from each other in a direction crossing the supports.

The fixing member may include: a bolt inserted into each of the plurality of fixing holes; and at least one nut coupled to the bolt.

At least one slit passing through the support may be defined in the support.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

Figure 1:
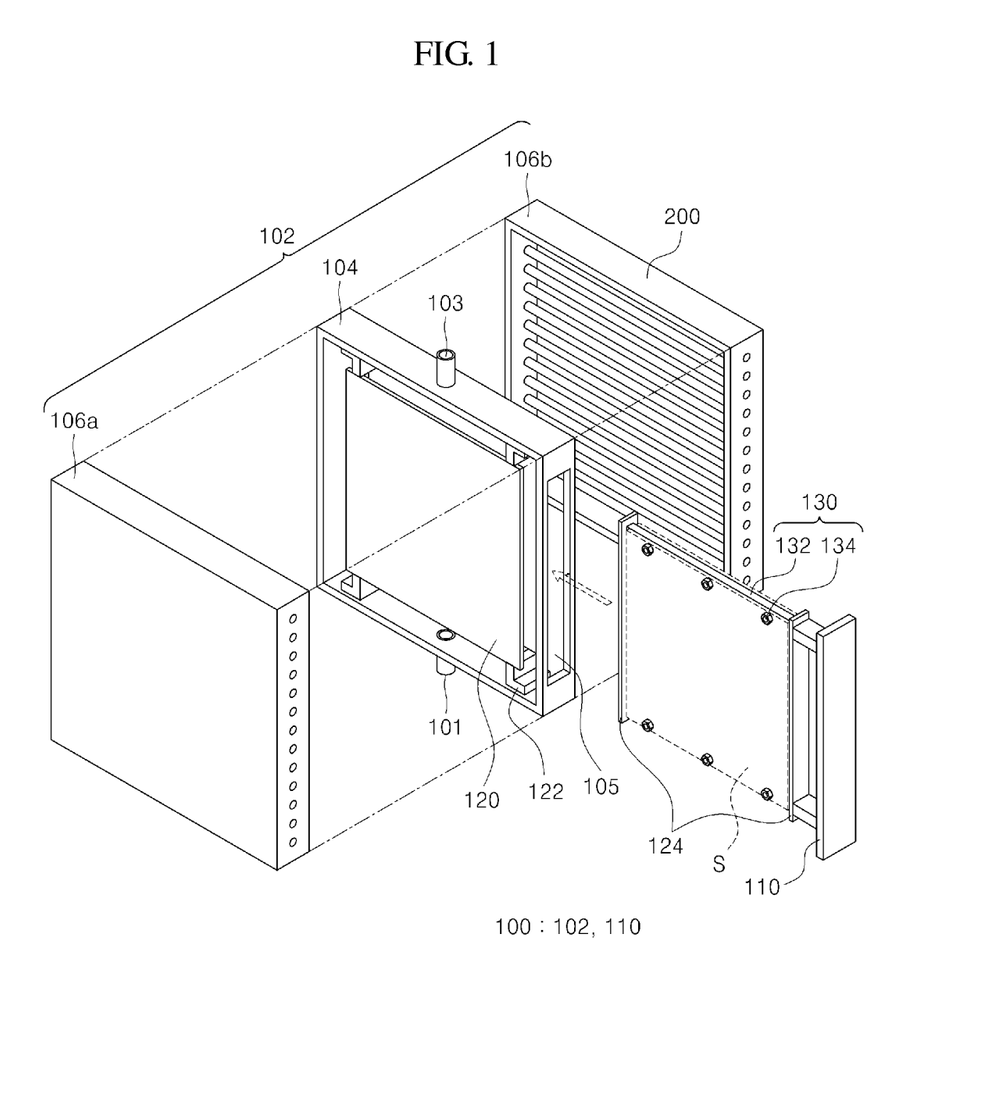
FIG. 1 is an exploded view of a substrate processing apparatus in accordance with an exemplary embodiment.
Figure 2:
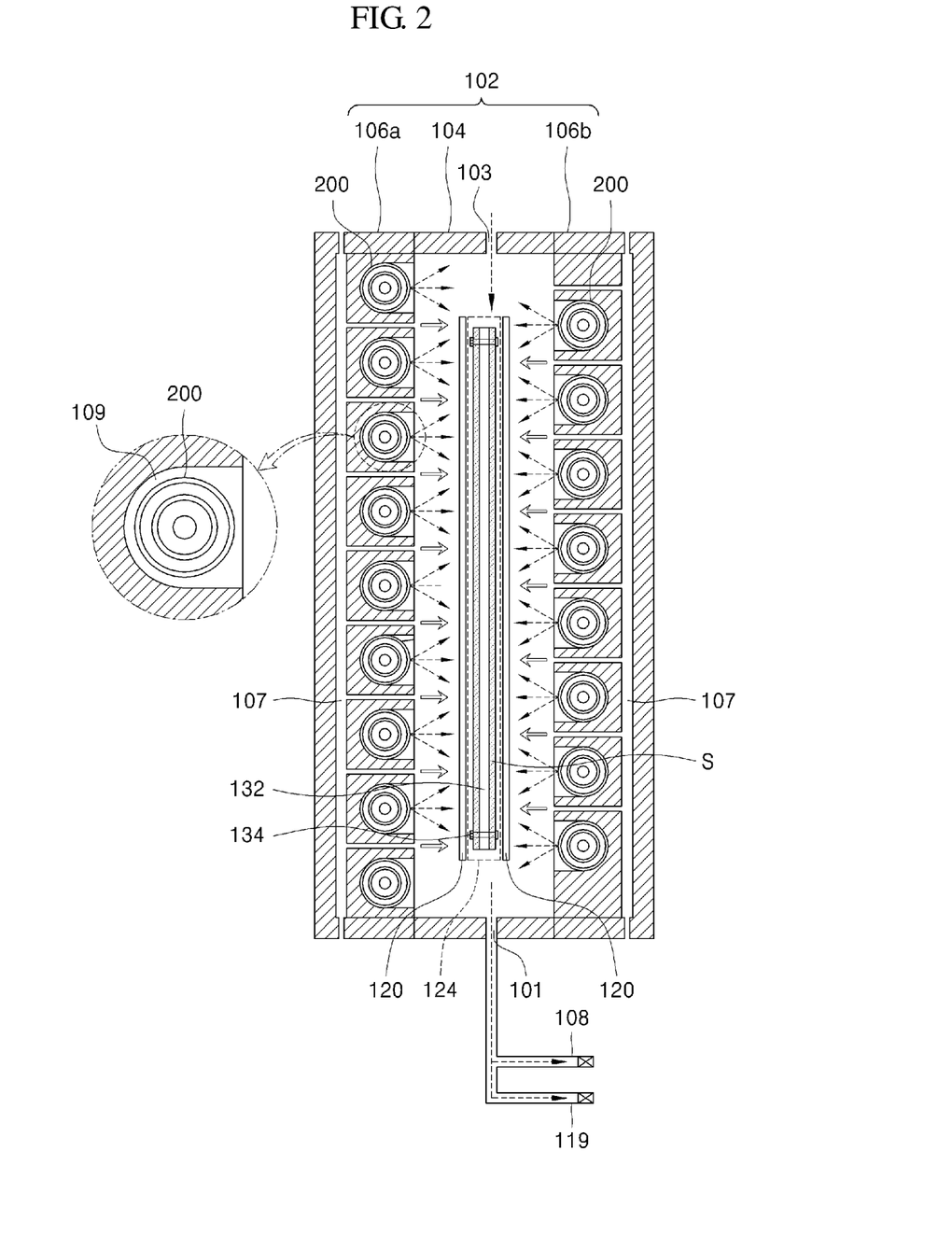
FIG. 2 is a cross-sectional view of a substrate processing apparatus in accordance with an exemplary embodiment.

FIG. 1 is an exploded view of a substrate processing apparatus in accordance with an exemplary embodiment, and FIG. 2 is a cross-sectional view of a substrate processing apparatus in accordance with an exemplary embodiment.

Referring to FIG. 1, a substrate processing apparatus according to an embodiment includes a main body 102 providing an inner space in which a substrate S is processed, a chamber 100 including a door 100 openably disposed on one side of the main body 102, first susceptors 120 spaced apart from each other within the chamber 100, supports 130 connected to one side of the door 110 to support the substrate S in parallel to the first susceptors 120, second susceptors disposed on the supports in a length direction of the door and disposed spaced apart from each other in a direction crossing to the first susceptors, and heat source units 200 disposed on both sides of the chamber 100 to emit radiation light for heating the susceptors 120. The first and second susceptors may define a space in which the substrate is processed within the chamber. Although the heat source units 200 are disposed on both sides of the chamber 100 in the current embodiment, the heat source unit 200 may be disposed on only one of both sides of the chamber 100. Although the shape of the chamber 100, the connection type of the heat source units 200, and the structure of each of the supports 130 may vary according to the positions of the heat source units 200, configurations and effects according to the exemplary embodiments may be the same.

The chamber 100 may have a space in which the substrate S is accommodated therein to heat the substrate S, i.e., a vacuum heating space. As illustrated, the chamber 100 may have an approximately box shape or block shape. Also, the chamber 100 may be integrally manufactured in one body. Alternatively, the chamber 100 may have an assembled body in which various components are connected or coupled to each other. In this case, sealing units (not shown) may be additionally provided on connection portions between the components. Thus, energy spent within the substrate processing apparatus when heating or cooling the substrate S may be saved.

The chamber 100 illustrated in FIG. 1 includes a hollow main body 102 providing an inner space in which the substrate is processed and the door 110 openably disposed on a front surface of the main body 102. The body 102 may include a hollow housing 104 of which both side surfaces are opened and having a gate 105 defined in a front surface thereof and covers 106a and 106b respectively connected to both side surfaces of the housing 104. The heat source units 200 mounted on the covers 106a and 106b may be used as heater blocks for heating the susceptors 120. A fixing groove 109 into which each of the heat source units 200 are mounted may be defined in each of the covers 106a and 106b. The fixing groove 109 may have an arch shape so that the radiation light emitted from the heat source unit 200 is collected and irradiated toward the susceptors 120. Also, the fixing groove 109 may have a size greater than that of the heat source unit 200 so that a surface of the fixing groove 109 is spaced apart from a surface of the heat source unit 200, and thus the radiation light may be effectively collected therethrough.

The chamber 100 constituted by the above-described constitutions may have a vertical long shape to allow the substrate S is vertically loaded, i.e., in a longitudinally loaded. For example, the housing 104 may have a vertical length greater than a length from one side surface of the cover 106a disposed on one side of the housing 104 to the other side surface of the cover 106b disposed at the other side of the housing 104. Thus, the housing 104 may have a vertically long hexahedron shape. When the chamber 100 has a shape of which a vertical surface is longer than a horizontal surface, a space in which the chamber 100 is installed may be reduced in volume when compared to the chamber 100 has a shape of which a horizontal surface is longer than a vertical surface. When the heat source unit 200 is disposed on only the one side surface of the chamber 100, the vertical length of the housing 104 may be longer than a length from one side surface of the cover to the one side surface of the housing.

Also, the gate 105 defined in the body 102, i.e., in the front surface of the housing 104 may have a size that is enough to load and unload the substrate S. The gate 105 may be opened and closed by the door 110. When the gate 105 is closed, the sealing member (not shown) may be disposed on the connection portion between the door 110 and the gate 105 to seal the inside of the chamber 100. Although the main body 105 is separated from the door 110 in the figure, a movement passage and a driving unit of the door 110 may be provided to automatically move the door 110, thereby opening and closing the gate 105.

A gas supply unit (not shown) for supplying process gas into the chamber 100 is disposed outside the chamber 100. A gas injection hole 103 for injecting the process gas supplied from the gas supply unit is disposed on one side surface of the chamber 100, and a gas exhaust hole 101 for exhausting gas within the chamber 100 is disposed on the other side surface of the chamber 100 which faces the gas injection hole 103. Although the gas injection hole 103 and the gas exhaust hole 101 may be variously changed in positions according to a structure of the support fixing the substrate S, in the current embodiment, the gas injection hole 103 is defined at an upper side of the chamber 100, and the gas exhaust hole 101 is defined at a lower side of the chamber 101. Here, the gas injection hole 103 faces the gas exhaust hole 101. Also, a vacuum line 119 for controlling an inner pressure of the chamber 100 and a cooling line 108 for cooling the inside of the chamber 100 may be connected to the gas exhaust hole 101. Here, pumps for effectively exhausting the inner gas of the chamber may be respectively disposed in the vacuum line 119 and the cooling line 108. Each of the pumps may be selectively operated to control the inner pressure of the chamber. In other words, in the related art, one vacuum line 119 has been used to control the inner pressure of the chamber. Here, when the inside of the chamber is cooled after the substrate is processed, cooling gas supplied into the chamber is exhausted to the vacuum line 119. In this case, since the cooling gas causes the damage of the pump, it may take a lot of time to cool the chamber having a high temperature of approximately 1,000° C. up to room temperature while supplying and exhausting a small amount of cooling gas. However, in this specification, the vacuum line 119 and the cooling line 108 are separately used to supply sufficient amount of cooling gas into the chamber and to exhaust the gas through the cooling line, and thus cooling time may be significantly reduced.

Also, a cooling passage 107 through which the cooling gas for cooling the heat source unit 200 and the susceptors 120 is supplied may be defined in the chamber 100. For example, the cooling passage 107 may be branched in the housing 104, the covers 106a and 106b, and the door 110 to uniformly spray the cooling gas to the susceptors 120. When the heat source unit 200 is disposed on any one side surface of the chamber 100, the cooling passage 107 may be defined at a side at which the heat source unit 200 is disposed. However, if necessary, the cooling passage 107 may be provided in various directions to improve cooling efficiency.

A liner (not shown) may be disposed on an inner wall of the chamber 100. The liner may be disposed on every place where the process gas reaches in the chamber 100 to absorb contaminants generated during the process. Like this, since the liner is applied to the inner wall of the chamber 100, a maintenance period of equipment may extend by replacing only the liner without cleaning the whole equipment. Here, the liner may be formed of at least one of graphite or graphite coated with silicon carbide (SiC), silicon carbide (SiC), silicon nitride ($Si_3N_4$), alumina ($Al_2O_3$), aluminum nitride (AlN), and quartz.

The first susceptor 120 may be vertically disposed within the chamber 100 and fixed to the inner wall of the chamber 100 by using a separate fixing unit 122, and thus be disposed in parallel to a direction in which the heat source units 200 are arranged. The first susceptors 120 may be provided in a pair. The pair of the first susceptors 120 is spaced apart from each other to allow the substrate S to be disposed therebetween when the substrate is processed. Each of the first susceptors may be spaced a predetermined distance apart from the inner wall of the chamber 100. In the above-described structure, when the inside of the chamber is cooled, the cooling gas supplied through the cooling passage 107 may be uniformly sprayed to the first susceptor 120 to improve cooling efficiency. Thus, the fixing unit 122 may have a shape in which an edge of the first susceptor 120 is partially connected to the inner wall of the chamber 100.

The first susceptor 120 may prevent the substrate S from being directly exposed to the radiation light irradiated from the heat source unit 200 when the substrate is processed. That is, in the current embodiment, a metal thin film formed of nickel (Ni), copper (Cu), cobalt (Co), molybdenum (Mo), magnesium (Mg), platinum (Pt), silver (Ag), chrome (Cr), manganese (Mn), titanium (Ti), or tungsten (W) is used as a substrate. When the radiation light is directly irradiated onto the substrate formed of the above-described metal material, the radiation light may be reflected from the substrate S, and thus it takes a lot of time to heat the substrate S to a process temperature, and also the more electric power is required. Thus, in the current embodiment, the first susceptor 120 formed of a material absorbing the radiation light and having excellent heat conductivity may be disposed between the heat source unit 200 and the substrate S to allow the substrate S to be indirectly heated through the first susceptor 120 heated by the radiation light. The first susceptor 120 may be formed of at least one of graphite or graphite coated with silicon carbide (SiC), silicon carbide (SiC), silicon nitride ($Si_3N_4$), alumina ($Al_2O_3$), aluminum nitride (AlN), and quartz.

A temperature measurement part (not shown) for measuring a temperature of the first susceptor 120 may be disposed on the first susceptor 120. The temperature measurement part may be disposed on at least one of the pair of the first susceptors 120. The temperature measurement parts are spaced a predetermined distance apart from each other on the first susceptor 120 having a plate shape. Alternatively, the temperature measurement parts may be disposed on a central portion and edge parts of the first susceptor 120. The temperature measurement part may not be limited to the number and position thereof.

The heat source unit 200 is disposed in the fixing groove 109 defined in the chamber 100 to heat the first susceptor 120 disposed within the chamber 100. The heat source unit 200 includes a heat source generating the radiation light and a window for protecting the heat source by surrounding and allowing the radiation light generated from the heat source to be transmitted to the outside. The heat source may use at least one of a tungsten halogen lamp, a carbon lamp, and a ruby lamp. Here, various type of heat sources such as a linear or bulb type may be used.

For example, when a linear heat source is used, a plurality of heat source units 200 may be arranged spaced a predetermined apart from each other or may be arranged in a lattice shape. In this case, a sealing member (not shown) such as a O-ring may be inserted into a connection portion between the heat source units 200 and the main body 102 to seal the inside of the chamber 100, thereby preventing the process gas within the chamber 100 from being leaked during the process. Also, in order to prevent the heat source units 200 from being exposed to the inner space of the chamber 100 after each of the heat source units 200 is mounted in the fixing groove 109, a transmission window (not shown) may be disposed on a front surface of the heat source unit 200. In this structure, deposition of thin film materials on the heat source unit 200 during the process for depositing the thin film may be restrained to extend a lifespan of the heat source unit 200.

A reflection layer (not shown) may be disposed on a portion of a surface of the heat source. In the linear heat source, the radiation light is emitted in a radial shape. Here, since the first susceptor 120 that is a target to be heated is disposed to face the heat source, it is necessary to improve heating efficiency of the first susceptor 120 by controlling a proceeding direction of the radiation light emitted from the heat source. Thus, a reflection layer (not shown) for reflecting the radiation light toward the first susceptor 120 may be disposed on the portion of the surface of the heat source. The reflection layer may be disposed on an outer circumferential surface in the range of an angle of approximately 20° to approximately 300° from a central portion of the heat source. When the reflection layer is disposed in a range greater than a preset range, since an area onto which the radiation light is transmitted is significantly reduced, it is difficult to uniformly heat the first susceptor 120. When the reflection layer is disposed on a range less than the preset range, since the radiation light reflected through the reflection layer may be reduced in amount, it is difficult to effectively heat the first susceptor 120. Thus, the reflection layer may be formed of a material having an excellent reflection rate and formed of a metal material such as ceramic, nickel (Ni), or an alloy of nickel (Ni)/gold (Au).

The reflection layer may be disposed on a surface of the fixing groove 109 in which the heat source unit 200 is disposed. Since the fixing groove 109 has an arch shape to collect the radiation light emitted from the heat source, when the reflection layer is disposed on the surface of the fixing groove 109, the radiation light may be reflected from the surface of the fixing groove 109 and be irradiated toward the first susceptor 120. Thus, the radiation light may be further improved in collection efficiency to effectively heat the first susceptor 120 using a relatively small amount of electric power.

The support 130 is connected to the one side surface of the door 110, i.e., a surface facing the front surface of the chamber 100 to support the substrate S. The substrate S is loaded in and unloaded from the chamber 100 while being supported by the support 130 in the direction parallel to the first susceptor 120.

In the current embodiment, a metal thin film may be used as the substrate S. Here, the support 130 may be configured to support the substrate in a flat state.

Figure 3:
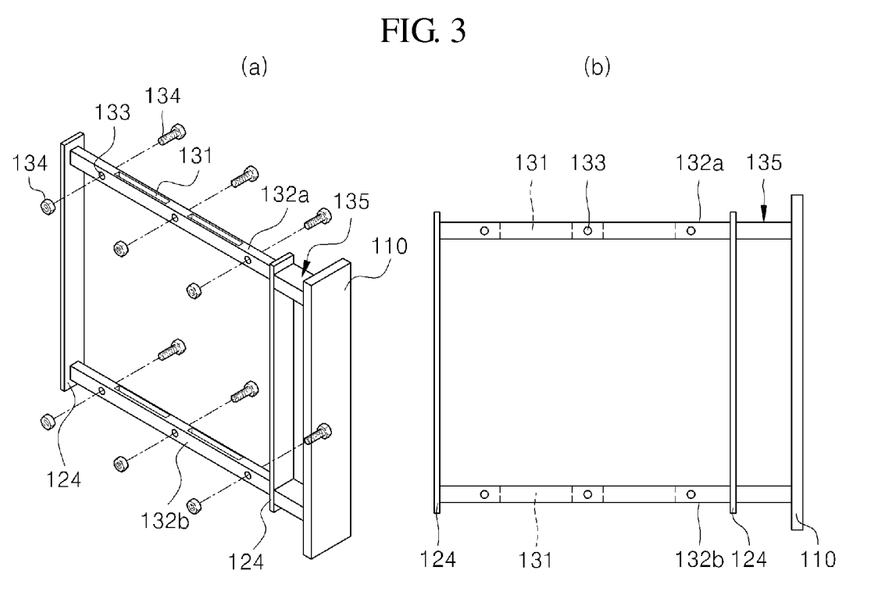
FIG. 3 is a view of a support in accordance with an exemplary embodiment.
Figure 4:
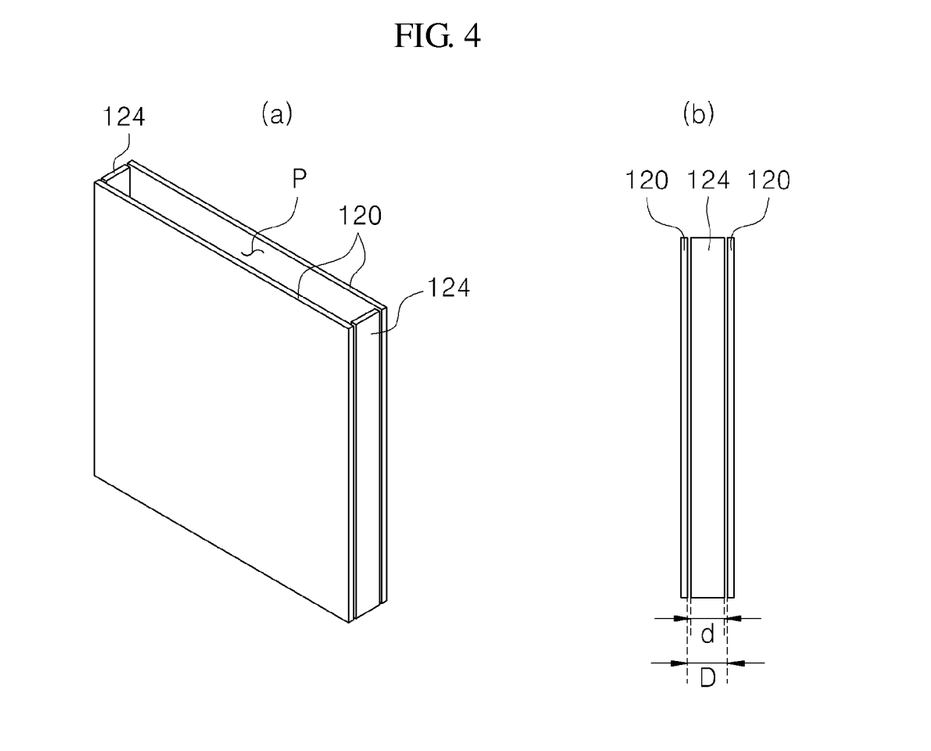
FIG. 4 is a view illustrating a state where a first susceptor is coupled to a second susceptor within a chamber when a substrate is processed.

FIG. 3 is a view of a support in accordance with an exemplary embodiment, and FIG. 4 is a view illustrating a state where a first susceptor is coupled to a second susceptor within a chamber when a substrate is processed.

Referring to FIG. 3, the support 130 for supporting the substrate S is connected to the one side surface of the door 110, and a second susceptor 124 is connected to the support 130. The support 130 includes a first support part 132a connected to an upper portion of the one side surface of the door 110, a second support part 132b connected to a lower portion of the one side surface of the door 110, and a plurality of fixing members 134 fixing the substrate S to the support parts 132a and 132b.

The first support part 132a and the second support part 132b are spaced apart from each other and disposed parallel to each other. A plurality of fixing holes 133 may be defined to pass through the support parts 132a and 132b. A slit 131 vertically passing through each of the support parts 132a and 132b may be defined in each of the first and second support parts 132a and 132b. The slit 131 may be used as a passage in which the process gas flows when the substrate is processed. Particularly, the slit 131 defined in the first support part 132a may be used as an inflow passage through which the process gas is introduced into a substrate processing space defined by the first and second susceptors 120 and 124. The slit 131 may be used as an exhaust passage through which the process gas within the substrate processing space is exhausted to the exhaust hole 101. The fixing hole 133 may be defined in a direction perpendicular to a longitudinal direction of the support parts 132a and 132b so that the substrate S is connected to both side surfaces of the support parts 132a and 132b.

The fixing member 134 may have various shapes which are capable of fixing the substrate S to the first and second support parts 132a and 132b, and for example, a bolt 134a inserted into the fixing hole 133 and a nut 134b coupled to the bolt 134a may be used.

When two substrates are fixed to the support parts 132a and 132b, each of the substrates S is disposed on each of the both side surfaces of the support parts 132a and 132b. Here, the support parts 132a and 132b are disposed between the substrates S. Then, the bolt 134a may pass through the fixing hole 133 and the substrate S, and the nut 134b is coupled to an end of the bolt 134a. Thus, the substrates S may be fixed to the support parts 132a and 132b. Here, a through hole (not shown) may be defined in an edge of each of the substrates S at a position corresponding to the fixing hole 133 in advance, so as to easily fix the substrates S to the support parts 132a and 132b. Upper edge and lower edge of each of the substrates S may be fixed to the first and second support parts 132a and 132b so that the substrate S is maintained at a flat state. Thus, a large-area substrate S may be easily loaded in the chamber 100 in a longitudinal direction, and thus, sagging phenomenon of the substrate S due to a weight of the substrate S may be restrained. Also, since the first and second support parts 132a and 132b are disposed between the substrates S to space the upper and lower portion of the substrate S apart from each other, and the process gas moves through the slit 131, the process gas may be smoothly introduced between the substrates S, when the process is performed, to uniformly process the entire substrate S.

Also, the support 130 may variously change in structure to fix the substrate S.

The second susceptors 124 may have a plate shape of which a vertical length is longer than a horizontal length d and may be disposed on both sides of the first and second support parts 132a and 132b, respectively. Here, the second susceptor 124 may have a horizontal length d less than a distance D between the first susceptors 120. In detail, the second susceptors 124 may be disposed in a length direction of the door 110, i.e., in a vertical direction and may be spaced apart from each other by a distance greater than a length of the substrate on one and the other end of each of the first and second support parts 132a and 132b. The second susceptor 124 may be connected to the first and second support parts 132a and 132b in a direction perpendicular to the length direction of each of the first and second support parts 132a and 132b and may be disposed in parallel to the door 110. Or, the second susceptor 124 may be disposed perpendicular to the first susceptor 120. In this structure, when the door 110 is inserted into the chamber 100, the second susceptors 124 are disposed at both edges of the first susceptor 120 to form a hollow box shape of which upper and lower portions are opened, as illustrated in FIG. 4 (*a*). Thus, one more space P may be defined by the first and second susceptors 120 and 124 within the chamber 100. This space may be the space P in which the substrate is substantially processed within the chamber 100. Here, since the second susceptors 124 are inserted between the first susceptors 120, in a state where the second susceptors 124 are connected to the door 110, to define the space P in which the substrate S is processed, the second susceptor 124 may have the horizontal length d less than the distance D between the first susceptors 120, as illustrated in FIG. 4 (*b*).

Like this, since the separate space P in which the substrate is processed is defined within the chamber 100 by using the first susceptors 120 disposed within the chamber 100 and the second susceptors 124 installed to the door 110, the substrate may be processed in a space relatively smaller than the inner space of the chamber 100. Thus, temperature control for processing the substrate S or atmospheric control using the process gas may be easily performed. Therefore, the substrate may be uniformly processed to improve substrate processing efficiency and productivity.

A method for depositing a graphene on the substrate using the substrate processing apparatus having the above-described structure.

Figure 5:
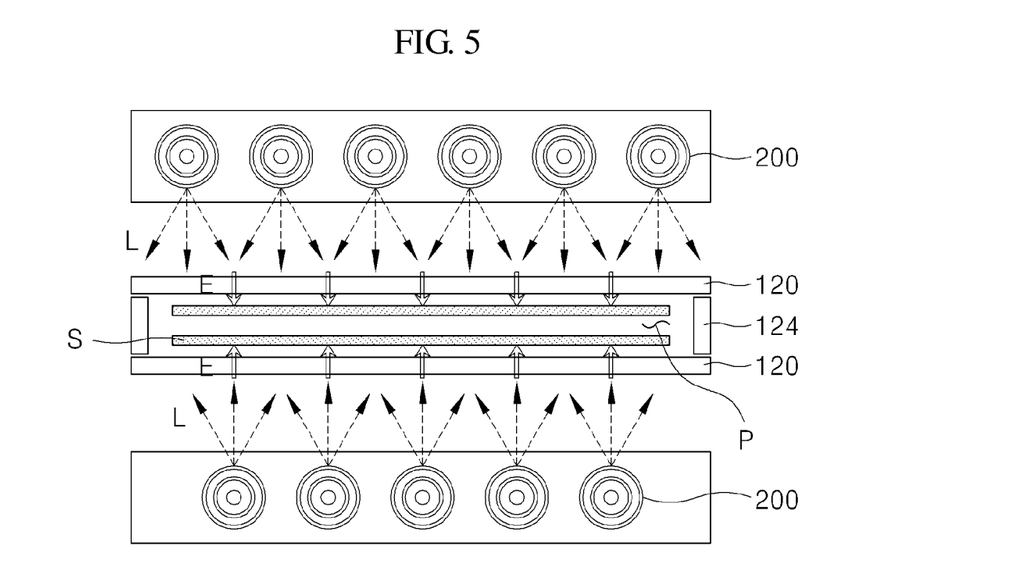
FIG. 5 is a conceptual view illustrating a principle in which the substrate is heated when manufacturing graphene by using the substrate processing apparatus in accordance with an exemplary embodiment.

FIG. 5 is a conceptual view illustrating a principle in which the substrate is heated when manufacturing graphene by using the substrate processing apparatus in accordance with an exemplary embodiment.

The substrate S is fixed to the support parts 132a and 132b connected to the door 110 in a vertical direction. Since the substrate S has upper and lower edges fixed by the support parts 132a and 132b, the substrate S may be maintained at a flat state. Here, the substrate S may be formed of at least one of nickel (Ni), copper (Cu), cobalt (Co), molybdenum (Mo), magnesium (Mg), platinum (Pt), silver (Ag), chrome (Cr), manganese (Mn), titanium (Ti), and tungsten (W). Also, the substrate S may have a thin plate shape.

When the substrate S is fixed to the support parts 132a and 132b, the substrate S is loaded in the chamber 100 by moving the door 110. Here, the gate 105 is closed by the door 110, and the second susceptors 124 disposed on the support parts 132a and 132b of the door 110 is inserted between the first susceptors 120 vertically installed within the chamber 100 to define the substrate processing space P. Also, the substrate S is disposed in the substrate processing space formed as described above.

Then, gas within the chamber 100 is exhausted through the vacuum line connected to the exhaust hole 101 in the lower portion of the chamber 100. The inner pressure of the chamber 100 is in a vacuum state. Here, the inner pressure of the chamber 100 may be controlled at a range of approximately 0.01 torr to approximately 50 torr.

Then, the process gas is supplied through the gas injection hole 103 while heating the first susceptors 120 by operating the heat source unit 200 to deposit graphene on the substrate S. Here, the first susceptors 120 may be heated to a temperature of approximately 800° C. to approximately 1,050° C., and gas containing carbon such as methane ($CH_4$), ethane ($C_2H_6$), acetylene ($C_2H_2$), and benzene ($C_6H_6$) may be used as the process gas. While the graphene is deposited onto the substrate S, the process gas is supplied through the gas injection hole 103, and at the same time, non-reaction gas and residual substances are exhausted through the exhaust hole 101.

The radiation light irradiated from the heat source while the graphene is deposited onto the substrate S passes through the window and then is irradiated to the first susceptors 120. Thus, the first susceptors 120 is heated to a preset temperature by the radiation light irradiated from the heat source, and the second susceptors 124 and the substrate S disposed in the substrate processing space P are indirectly heated by thermal-transmission of the heated first susceptors 120. Here, the substrate S may be rapidly and uniformly heated by the thermal transfer (i.e., radiation or conduction) of the heated first susceptors 120 in a state where the substrate S is held in the relatively small substrate processing space P within the chamber 100. Also, since the substrate S is indirectly heated by the thermal-transmission, damage on the substrate S due to direct heating with high temperature heat may be prevented. Also, since a temperature within the substrate processing space P is constantly maintained by the first and second susceptors 120 and 124, the substrate S may be constantly maintained in temperature while the graphene is deposited to uniformly deposit a graphene thin film on the substrate S.

Then, when a graphene thin film having a desired thickness is deposed onto the substrate S, the operation of the heat source units 200 is stopped, and the cooling gas is supplied into the chamber 100 through the cooling passage 107 to cool the first and second susceptors 120 and 124, and the substrate S. Here, the cooling gas supplied through the cooling passage 107 into the chamber 100 may be at least one of nitrogen (N), argon (Ar), and helium (He). When the cooling gas is supplied, a cooling line 108 connected to the exhaust hole 101 in the lower portion of the chamber 100 may be opened to exhaust the cooling gas. Thus, since large amount of cooling gas is supplied and exhausted, when compared to the related art, by selectively using the vacuum line 119 for forming vacuum environment within the chamber 100 and the cooling line 108 for cooling, time for cooling the susceptors 120 and 124 and substrate S may be reduced.

In the substrate processing apparatus according to an embodiment, the susceptors having the box shape may be disposed within the chamber to uniformly process the substrate. That is, the space in which the substrate is substantially processed may be reduced in size, and the process gas is uniformly supplied into the reduced space to uniformly process the substrate. Also, in this structure, the amount of the process gas used to process the substrate may be reduced to decrease costs for processing the substrate.

Also, since the substrate processing apparatus has a structure in which the substrate is vertically loaded in the chamber, the substrate having the large area may be easily processed. Also, even though the substrate has a small thickness, the substrate may be stably loaded in the chamber without sagging, and thus the entire substrate may be uniformly processed. The installation space of the chamber is reduced to effectively use the space, and thus, costs for manufacturing equipments may be reduced.

Also, the substrate processing apparatus according to the embodiment may heat the substrate accommodated in the process chamber by applying a rapid thermal processing (RTP) method to mass-produce the graphene. Thus, commercialization of the graphene having various electrical, mechanical, and chemical advantages may be promoted.

Particularly, the process chamber and the heat source irradiating the radiation light are provided to primarily heat the susceptors by the heating action of the heat source, and then the substrate is secondarily uniformly heated by the thermal-transmission (i.e., radiation or conduction) by the heated susceptors, thereby easily manufacturing the graphene thin film.

Although the substrate processing apparatus has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:
1. A substrate processing apparatus comprising:
a chamber comprising a chamber body of which one side is opened and having an inner space and a door configured to open and close the chamber body;

first susceptors disposed to be spaced apart from each other within the chamber;

supports connected to one side surface of the door to support the substrate in parallel to the first susceptors;

second susceptors disposed on the supports along a longitudinal direction of the door in parallel to the door, the second susceptors being spaced apart from each other in a direction crossing the first susceptors so as to be disposable on both edges of the first susceptors; and at least one heat source unit disposed on at least one surface of the chamber to heat the first susceptors, wherein the first susceptors are separate from the second susceptors, wherein each of the first susceptors is fixed to an inner wall of the chamber by using a fixing unit that partially connects an edge of each of the first susceptors to the inner wall of the chamber, wherein each of the second susceptors has a horizontal length that is less than a spaced distance between the first susceptors so that the second susceptor is insertable between the first susceptors to define a substrate processing space having a box shape having opened upper and lower portions when the chamber body is closed by moving the door, and wherein the second susceptors are fixed to the supports while spaced by a distance greater than a length of the substrate in a direction crossing the supports.

2. The substrate processing apparatus of claim 1, wherein the chamber comprises:

a gas injection hole defined in one side of the chamber to inject process gas therethrough; and a gas exhaust hole defined in the other side facing the gas injection hole to exhaust the gas within the chamber therethrough.

3. The substrate processing apparatus of claim 2, wherein a vacuum line for adjusting an inner pressure of the chamber and a cooling line for cooling the inside of the chamber are connected to the gas exhaust hole, and the vacuum line and the cooling line are selectively opened and closed.

4. The substrate processing apparatus of claim 1, wherein the chamber body comprises:

a hollow housing of which a front surface and at least one side surface are opened; and a cover connected to the opened side surface of the housing, wherein the heat source unit is disposed on the cover.

5. The substrate processing apparatus of claim 1, wherein each of the first and second susceptors are formed of at least one of graphite or graphite coated with silicon carbide (SiC), silicon carbide (SiC), silicon nitride (Si3N4), alumina (Al2O3), aluminum nitride (AlN), and quartz.

6. The substrate processing apparatus of claim 1, wherein the fixing member comprises:

a bolt inserted into each of the plurality of fixing holes; and at least one nut coupled to the bolt.

7. The substrate processing apparatus of claim 1, wherein at least one slit passing through the support is defined in the support.

* * * * *